(12) United States Patent
Wang et al.

(10) Patent No.: US 12,279,443 B2
(45) Date of Patent: Apr. 15, 2025

(54) FIELD EFFECT TRANSISTOR DEVICE, AND METHOD FOR IMPROVING SHORT-CHANNEL EFFECT AND OUTPUT CHARACTERISTIC THEREOF

(71) Applicant: Soochow University, Suzhou (CN)

(72) Inventors: Mingxiang Wang, Suzhou (CN); Lekai Chen, Suzhou (CN); Dongli Zhang, Suzhou (CN); Huaisheng Wang, Suzhou (CN)

(73) Assignee: Soochow University, Suzhou (CN)

( * ) Notice: Subject to any disclaimer, the term of this patent is extended or adjusted under 35 U.S.C. 154(b) by 255 days.

(21) Appl. No.: 17/997,200

(22) PCT Filed: Dec. 1, 2021

(86) PCT No.: PCT/CN2021/134782
§ 371 (c)(1),
(2) Date: Oct. 26, 2022

(87) PCT Pub. No.: WO2022/160923
PCT Pub. Date: Aug. 4, 2022

(65) Prior Publication Data
US 2023/0223466 A1    Jul. 13, 2023

(30) Foreign Application Priority Data
Jan. 27, 2021 (CN) .......................... 202110110414.X

(51) Int. Cl.
*H10D 30/47* (2025.01)
*H10D 64/00* (2025.01)

(52) U.S. Cl.
CPC ......... *H10D 30/472* (2025.01); *H10D 30/477* (2025.01); *H10D 64/118* (2025.01)

(58) Field of Classification Search
CPC .............. H01L 29/7781; H01L 29/408; H01L 29/7788; H01L 29/4983; H01L 29/7839; H01L 29/788; H01L 29/0847; H01L 29/7835; H01L 29/7836; H01L 29/78645; H01L 29/78642; H01L 29/792; H01L 29/41766; H01L 29/66409; H01L 29/78; H01L 29/7727; H01L 29/66568–66659; H10D 30/472; H10D 64/118; H10D 30/026; H10D 30/751; H10D 62/213; H10D 30/027–0278; H10D 62/299; H10D 62/307; H10D 62/314
See application file for complete search history.

(56) References Cited

U.S. PATENT DOCUMENTS 6,348,387 B1 * 2/2002 Yu ...................... H01L 29/7831
257/E29.264
2018/0076281 A1 * 3/2018 Shau ..................... H01L 29/785

* cited by examiner

*Primary Examiner* — Shahed Ahmed
(74) *Attorney, Agent, or Firm* — Wang Law Firm, Inc.

(57) ABSTRACT

The present invention provides a field effect transistor device and a method for improving the short-channel effect and the output characteristics using the same. The field effect transistor device comprises an active layer comprising a source region, a drain region, and a channel region located between the source region and the drain region; when the device is turned on, an effective channel and an equivalent source and/or equivalent drain away from the effective channel are formed in the channel region, and the field effect transistor device connects the source region with the drain region through the effective channel, and the equivalent source and/or equivalent drain to form an operating current.

16 Claims, 10 Drawing Sheets

FIELD EFFECT TRANSISTOR DEVICE, AND METHOD FOR IMPROVING SHORT-CHANNEL EFFECT AND OUTPUT CHARACTERISTIC THEREOF

CROSS-REFERENCE TO RELATED INVENTIONS

The present invention claims priority to the Chinese patent invention 202110110414.X entitled "field effect transistor device, and method for improving short-channel effect and output characteristic thereof" filed on Jan. 27, 2021, to the China National Intellectual Property Administration, the entire contents of which are incorporated herein by reference.

TECHNICAL FIELD

The present invention specifically relates to a field effect transistor device and a method for improving the short-channel effect and the output characteristics thereof, which fall within the technical field of semiconductor devices.

BACKGROUND ART

With the development of integrated circuit technology, the gate length (corresponding to the channel length) of a field effect transistor gradually shrinks, and the VLSI chips based on sub-micron gate length devices or devices whose gate lengths are about 10 nanometers have been mass-produced. For devices of such small sizes, how to cope with their short-channel effects is an important challenge in device technology. The short channel effect makes both the threshold voltage and the sub-threshold characteristics of devices with small sizes deteriorate. Specifically, the threshold voltage of a device is no longer a constant, but decreases with the decrease of the channel length and decreases with the increase of drain voltage; the subthreshold region slope in device transfer characteristic also degrades simultaneously.

The main current approaches to improve the short-channel effect of field effect transistor devices include Fin Field Effect Transistor (FinFET), Silicon-On-Insulating layer (SOI), Lightly Doped Drain (LDD) structure, metal source-drain Schottky barrier transistor (SB MOSFET), etc. The channel region of FinFET is a 3D fin-type thin sheet, and the gate is a three-sided surrounding gate structure. The two side gates enhance the control of the gate on the channel and effectively inhibit the short-channel effect. The preparation process of the device in this scheme is much more complex than that of the planar device. Currently, integrated circuits of technology nodes below 22 nm mostly adopt the FinFET scheme. The SOI technology introduces a buried oxide layer between the silicon channel layer and the back substrate such that it can effectively suppress the leakage current between the source and drain under the condition that the channel layer is very thin and fully depleted. The difficulty of this scheme is that the cost of the SOI silicon integrated circuits is very high. At present, integrated circuits based on 10-nanoscale technology of the SOI scheme have been mass-produced. The LDD is arranged in the channel near the drain region while the source-drain region far away from the channel is still heavily doped. The PN junction formed at the drain end by the lightly doped region reduces the influence of the drain voltage on the channel, and is the mainstream technical solution of a sub-micron short channel device. The on-state current and field effect mobility of the device are both reduced to a certain extent by the influence of the LDD. The operating current of the Schottky barrier transistor is the tunneling/emission current of the Schottky barrier between the metal source and the semiconductor channel and is not sensitive to the short-channel effect. The scheme is difficult to process, and the choice of barrier material is limited, and it is difficult to balance the suppression of the off-state current of the device.

On the other hand, the kink effect appearing on the output characteristic curve of the short channel device also receives much attention. When the device operates in a saturation condition, the high drain voltage makes the PN junction at the drain end widen and forms a high electric field region, where the carrier is prone to impact ionization effect here, and is coupled with bipolar junction transistors (BJTs) parasitic on MOS devices for amplification. Therefore, the drain current increases rapidly with the increase of the drain voltage, forming the so-called kink current. The output characteristic curve of the device greatly warps, seriously affecting the normal output characteristics.

The common methods for improving the kink effect mainly include increasing the device channel length and Lightly Doped Drain (LDD) structure. Increasing the channel length can reduce the influence of carriers generated by impact ionization at the drain end on the source end, weaken the parasitic BJT transistor effect, and mitigate the kink effect. However, the increase in channel length will correspondingly decrease the output current of the device. The LDD structure can reduce the peak value of the electric field in the depletion region at the drain end and weaken the carrier impact ionization effect, thus suppressing the kink effect. However, the LDD structure can introduce additional parasitic resistance and reduce the field effect mobility and the on-state current of the device.

SUMMARY OF THE INVENTION

The main objective of the present invention is to provide a field effect transistor device and a method for improving the short-channel effect and output characteristics thereof.

In order to achieve the above-mentioned object of the present invention, the present invention comprises a field effect transistor device. The field effect transistor device includes an active layer. The active layer comprises a source region, a drain region, and a channel region located between the source region and the drain region. When the device is turned on, an effective channel and an equivalent source and/or an equivalent drain away from the effective channel are formed in the channel region, and the field effect transistor device connects the source region with the drain region through the effective channel and the equivalent source and/or the equivalent drain to form an operating current.

In an embodiment, a conductive region that does not connect the source region and the drain region is formed in the channel region. When the conductive region is in connection with the source region, the conductive region constitutes the equivalent source; and/or when the conductive region is in connection with the drain region, the conductive region constitutes the equivalent drain.

In an embodiment, a first gate provided on the surface of one side of the active layer is included. Perpendicular projections of the first gate and the conductive region on the channel region overlap; the first gate may control the channel region and form a channel therein, a portion of the channel that does not overlap with the vertical projection of the conductive region on the channel region constituting the effective channel; and/or, the conductive region is spaced from the effective channel in a thickness direction of the channel region.

In an embodiment, when the device is turned on, the conductance of the conductive region is greater than that of the rest portion of the channel other than the effective channel so that at least one of the conductive region and the effective channel can inject carriers into the other; preferably, the conductance of the conductive region is at least greater than three times of the conductance of the rest portion of the channel other than the effective channel; and/or the field effect transistor device is a planar structure device or a vertical structure device.

In an embodiment, when the device is turned on, the conductance per unit length of the effective channel in the channel is smaller than the conductance per unit length of the rest portion other than the effective channel of the channel.

Preferably, the field effect transistor device comprises a gate insulating layer provided between the first gate and the channel region, wherein a thickness of a portion of the gate insulating layer corresponding to the effective channel is larger than the thickness of the rest portion of the gate insulating layer; and/or a portion of the gate insulating layer corresponding to the effective channel and the rest portion of the gate insulating layer are made of materials having different work functions; and/or a portion of the first gate corresponding to the effective channel and the rest portion of the first gate are made of materials having different work functions.

Preferably, the conductance per unit length of the effective channel in the channel is at least three times smaller than the conductance per unit length of a rest portion of the channels other than the effective channel when the device is turned on.

In an embodiment, a second gate provided on the surface of one side of the active layer adjacent to the conductive region is further included, wherein the second gate can control the conductive region to be formed in the channel region.

In an embodiment, the conductive region is formed by a layer of carriers introduced by surface doping on one side of the channel region away from the effective channel.

In an embodiment, an insulating layer provided on a surface of one side of the active layer away from the effective channel is further included. The conductive region is composed of carriers induced in the channel region adjacent to the insulating layer. The carriers are induced through electrostatic induction by electric charges introduced into the insulating layer.

In an embodiment, a semiconductor material layer provided on a surface of one side of the active layer away from the effective channel is further included, the active layer and the semiconductor material layer forming a heterostructure, and the conductive region being composed by a two-dimensional electron gas channel or a two-dimensional hole gas channel distributed in the heterostructure; and/or the conductive region is composed of a two-dimensional electron gas channel or a two-dimensional hole gas channel formed by surface-treating a surface of one side of the channel region away from the effective channel.

In an embodiment, the source region and the drain region are a doped semiconductor or a Schottky metal source and drain; and/or a gate of the field effect transistor device is a metal-insulating layer-semiconductor MOS structure gate or a Schottky junction gate; and/or the active layer comprises at least two semiconductor materials changing along a thickness direction or a planar extension direction of the active layer.

The present invention also provides a method for improving short-channel effect and output characteristic of a field effect transistor device, wherein the method comprises providing an equivalent source and/or an equivalent drain, away from an effective channel of the device, in a channel region of the device such that when the device is turned on, the effective channel connects a source region with a drain region of the device through the equivalent source and/or the equivalent drain to form an operating current.

Compared with the prior art, the invention has advantages and positive effects as follows. When the device is set to be turned on, an effective channel, and an equivalent source and an equivalent drain away from the effective channel can be formed in the channel region so that the source region and the drain region are in connection to form an operating current. In this way, the equivalent drain (source) in connection with the drain (source) region is structurally away from the effective channel, so that the influence of the drain voltage on the effective channel can be reduced. The value of the peak electric field in the depletion region at the drain end when the device is operated in saturation is reduced, thereby suppressing the short-channel effect of the device and improving the output characteristics of the device.

DETAILED DESCRIPTION OF THE INVENTION

Exemplary embodiments that embody the features and advantages of the present invention are described in detail in the following description. It should be understood that the invention is capable of various modifications in various embodiments, all without departing from the scope of the invention, and that the description and drawings are to be regarded as illustrative in nature, rather than restrictive of the present invention.

Unless defined otherwise, all technical and scientific terms used herein have the same meaning as commonly understood by one of ordinary skill in the art to which this invention belongs. The terminology used herein in the description of the invention herein is for the purpose of describing particular embodiments only and is not intended to be limiting of the present invention.

Figure 1:
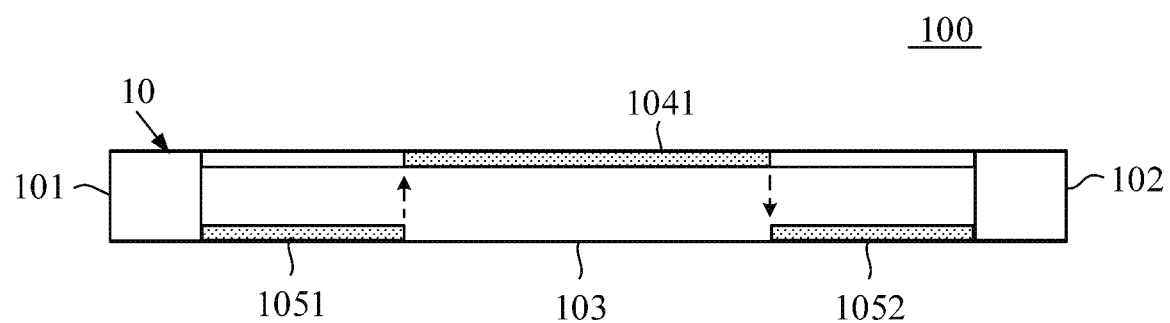
FIG. 1 is a schematic view of a state in which a field effect transistor device, in an on-state, forms an equivalent source, an equivalent drain, and an effective channel according to an embodiment of the present invention.

Referring to FIG. 1, a field effect transistor device 100 according to a specific embodiment of the present invention is described. In this embodiment, the field effect transistor device 100 comprises an active layer 10 comprising a source region 101, a drain region 102, and a channel region 103.

The source region 101 and the drain region 102 are respectively located on two sides of the active layer 10, and the channel region 103 is located between the source region 101 and the drain region 102. As shown in FIG. 1 when the device is turned on, an effective channel 1041, and an equivalent source 1051 and an equivalent drain 1052 away from the effective channel 1041 are now formed in the channel region 103 of the field effect transistor. The field effect transistor device 100 connects the source region 101 and the drain region 102 via the effective channel 1041, the equivalent source 1051, and the equivalent drain 1052 to form an operating current.

Reference herein to "away" between the effective channel 1041 and the equivalent source 1051 and the equivalent drain 1052 may refer to having a spacing in the thickness direction of the channel region 103 or having a spacing in both the thickness direction of the channel region 103 and between the vertical projections of the channel region 103.

In one typical field effect transistor device 100, the source region 101 in the active region is used to provide carriers when the device is turned on, while the drain region 102 is used to collect carriers provided by the source region 101. Accordingly, in the present invention, reference to an equivalent source 1051 refers to a structure in which carriers provided by the source region 101 are directly injected into the effective channel 1041, and an equivalent drain 1052 refers to a structure in which carriers are directly received from the effective channel 1041 and injected into the drain region 102.

Figure 2:
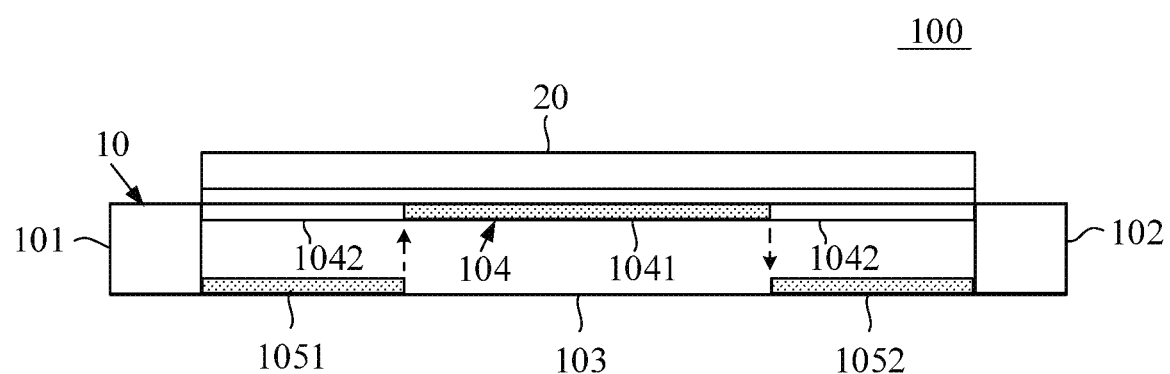
FIG. 2 is a schematic structural diagram of a field effect transistor device in an on-state according to an embodiment of the present invention.

With reference to FIG. 2, the "effective channel 1041" as referred to in this invention refers to the channel that contributes to the main carrier passage when the device is turned on. As an example, one side surface of the active layer 10 may be provided with the first gate 20, and there is no space between the vertical projection of the first gate 20 on the active layer 10 and the source region 101 and the drain region 102. Therefore, when a gate bias is applied to the first gate 20 to turn the device on, a position below the first gate 20 can be controlled to form a channel 104 and the channel 104 is correspondingly connected to the source region 101 and the drain region 102 from a structural perspective. From a functional point of view, however, only the portion of the channel that does not overlap with the vertical projections of the equivalent source 1051 and the equivalent drain 1052 on the channel region 103 is used to conduct the operating current, and therefore only this portion of the channel will be referred to herein as the "effective channel 1041".

The arrangement of the equivalent source 1051 and the equivalent drain 1052 is equivalent to shortening the length of a portion of the channel which can conduct the operating current, namely, the effective channel 1041 is spaced apart from the source region 101 and the drain region 102. Besides, the equivalent drain 1052 in connection with the drain region 102 is structurally distant from the effective channel 1041 to reduce the effect of the drain voltage on the effective channel 1041. While the equivalent source 1051 in connection with the source region 101 is structurally distant from the effective channel 1041 to likewise reduce the effect of the drain voltage on the effective channel 1041 to improve the short-channel effect of the device.

Figure 3:
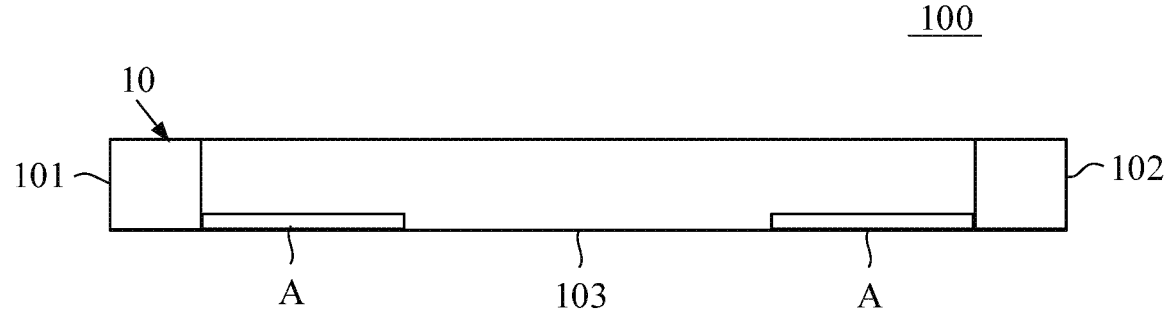
FIG. 3 is a schematic view of a state in which a field effect transistor device forms a conductive region according to an embodiment of the present invention.

With reference to FIG. 3, in the specific preparation of the equivalent source 1051 and the equivalent drain 1052, a conductive region A which does not connect a source region 101 and a drain region 102 can be formed in a channel region 103 such that when the conductive region A connects with the source region 101, this portion of the conductive region A constitutes the equivalent source 1051; when the conductive region A connects with the drain region 102, this portion of the conductive region constitutes an equivalent drain 1052.

When the device is turned on, the conductance of conductive region A is set to be greater than the conductance of the rest portion 1042 of the channel 104 except the effective channel 1041 so that carriers can be injected into each other between conductive region A and effective channel 1041. In this way, carriers in the source region 101 will be attracted by the equivalent source 1051 with a greater conductance and will not be directly injected into the rest portion 1042 of the channel 104 which is directly connected to the source region 101. Similarly, carriers transported in the effective channel 1041 will also be attracted by the equivalent drain 1052 without continuing to be transported through the rest portion 1042 of the channel 104. In the formation of the operating current of the present embodiment, the carrier provided by the source region 101 enters the equivalent source 1051, and is injected into the effective channel 1041 from one end of the equivalent source 1051 away from the source region 101. Carriers flowing through the effective channel 1041 will in turn be injected into the equivalent drain 1052 at one end adjacent to the equivalent drain 1052, and eventually into the drain region 102.

To achieve the carrier injection arrangement herein between the equivalent source 1051, the equivalent drain 1052, and the effective channel 1041, the conductance of the conductive region A may be arranged to be at least greater than three times of the conductance of the rest portion 1042 of the channel 104 other than the effective channel 1041. Besides, since carriers flow in the thickness direction of the channel region 103 during the above-described "injection", the spacing of the conductive region A and the effective channel 1041 in the thickness direction of the channel region 103 in this embodiment may be set to 5 nm~10 μm, or more preferably 10 nm~1 μm, or more preferably 10 nm~100 nm according to the specific design of different devices so as to ensure the normal injection of carriers and the performance of the device.

It needs to be noted that the reference to "carrier" in this invention refers to charge particles that is free to move in the corresponding polar channel/conductive region A. Generally, we refer to electrons in the N-type channel or holes in the P-type channel as the "carrier" herein, and correspondingly, the hole in the N-type channel or the electron in the P-type channel is not referred to as the "carrier" herein. Therefore, the polarities of the effective channel 1041 and the conductive region A are set to be the same in this invention such that the carrier interaction between two channels can ultimately contribute substantially to the operating current of the device.

Figure 4:
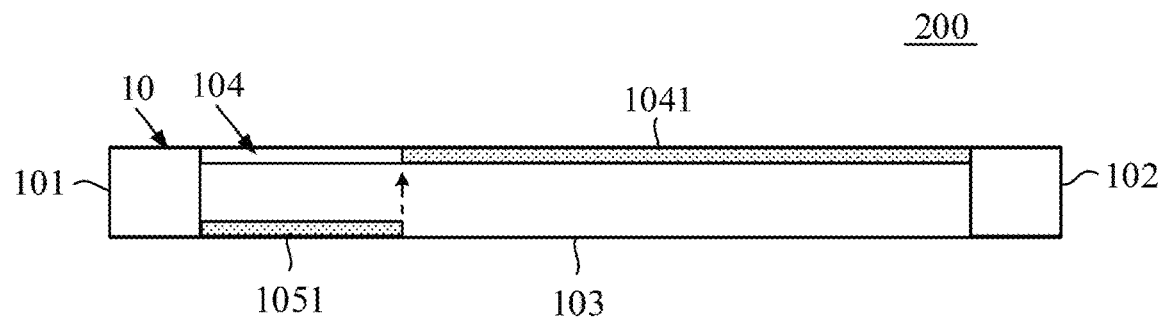
FIGS. 4 to 8 are schematic views of a field effect transistor device according to an embodiment of the present invention.

Referring to FIG. 4, a field effect transistor device 200 according to another embodiment of the present invention is described. Unlike the embodiments described above, in this embodiment, no equivalent drain is formed in the channel region 103 at this time when the device is turned on. The field effect transistor device 200 connects the source region 101 and the drain region 102 through the effective channel 1041 and the equivalent source 1051 to form an operating current.

In the present embodiment, it is equivalent to that the effect of the potential at the drain end on the potential near the source end of the channel region 103 is reduced only by the provision of the equivalent source 1051, thereby improving the short-channel effect of the device. Correspondingly, the effective channel 1041 is directly connected to the drain region 102.

In carrier transportation, the carrier provided by the source region 101 enters the equivalent source 1051, and is injected into the effective channel 1041 from one end of the equivalent source 1051 away from the source region 101; the carrier flowing through the effective channel 1041 is re-injected back to the drain region 102. That is, in this embodiment, only the conductive region injects carriers unidirectionally into the effective channel 1041.

Figure 5:
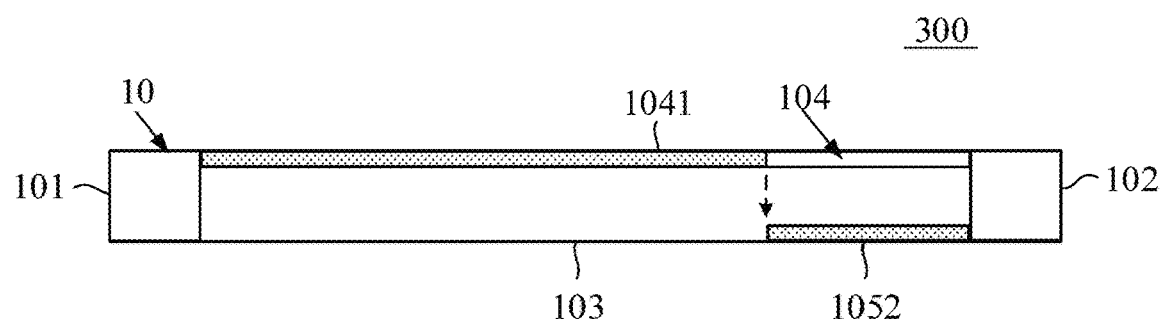

Referring to FIG. 5, another embodiment of a field effect transistor device 300 of the present invention is described. Unlike the embodiments described above, in this embodiment no equivalent source is formed in the channel region 103 at this time when the device is turned on. The field effect transistor device 300 connects the source region 101 and the drain region 102 through the effective channel 1041 and the equivalent drain 1052 to form an operating current.

In the present embodiment, it is equivalent to that the effect of the drain voltage on the effective channel 1041 is reduced by the provision of the equivalent drain 1052 alone, thereby improving the short-channel effect of the device. Correspondingly, the effective channel 1041 is directly connected to the source region.

In carrier transportation, the carrier provided by the source region 101 enters the effective channel 1041 and is injected into the equivalent drain 1052 from one end of the effective channel 1041 away from the source region 101 and is re-injected back into the drain region 102. That is, in this embodiment, only the effective channel 1041 injects carriers unidirectionally into the conductive region.

In the above-described embodiment, a structure in which a portion of the channel formed by the control of the gate constitutes the effective channel has been shown. In such a structure, to further improve the short-channel effect of the device, it may be provided that the effective channel in the channel has a conductance per unit length larger than that of the rest portion of the channel other than the effective channel Some corresponding embodiments are described below.

Figure 6:
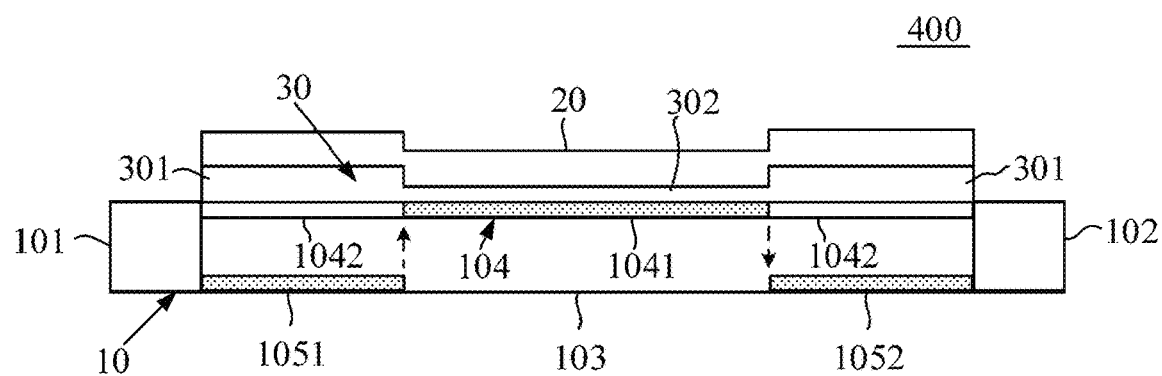

Referring to FIG. 6, another embodiment of a field effect transistor device 400 of the present invention is described. The field effect transistor device 400 comprises an active layer comprising a source region 101, a drain region 102, and a channel region 103. The source region 101 and the drain region 102 are respectively located on two sides of the active layer 10, and the channel region 103 is located between the source region 101 and the drain region 102.

An insulating layer 30 and a first gate 20 are successively arranged above the channel region, and the thickness of the gate insulating layer 1041 corresponding to the effective channel 104 is larger than the thickness of the rest portion of the gate insulating layer 1042. That is, the gate insulating layer 1042 of the corresponding portion of the equivalent source electrode 1051 and the equivalent drain electrode 1052 is thinned, so that the modulation capability of the gate corresponding to the rest portion channel 1042 apart from the effective channel 1041 to the corresponding portion channel 1042 can be enhanced, thereby increasing the electric conductance of the corresponding portion of the channel 1042.

Alternatively, it is also possible to adjust the material of the insulating layer to be different from that of the corresponding portion of the effective channel and the rest portion of the insulating layer so that the conductance of the effective channel in the channel is smaller than that of the remaining portion.

Figure 7:
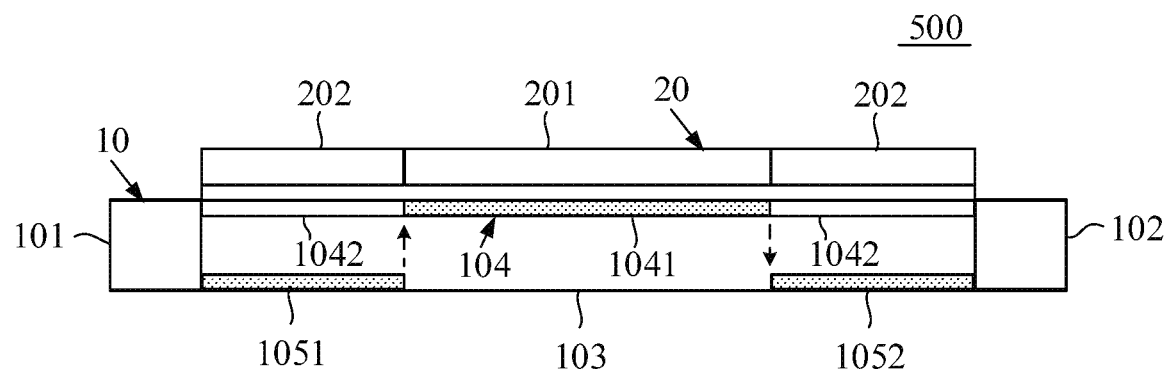

Referring to FIG. 7, another embodiment of a field effect transistor device 500 of the present invention is described. The field effect transistor device 500 comprises an active layer 10 comprising a source region 101, a drain region 102, and a channel region 103. The source region 101 and the drain region 102 are respectively located on two sides of the active layer 10, and the channel region 103 is located between the source region 101 and the drain region 102.

The first gate 20 is provided above the channel region 103, and a portion 201 corresponding to the effective channel 1041 and the rest portion 202 in the first gate 20 are made of different materials, so that the portion 201 corresponding to effective channel 201 and the remaining portion 202 in the first gate 20 have different modulation capabilities for the channel formed correspondingly, and the conductance of the effective channel 1041 is realized to be greater than the conductance of the rest portion 1042 of the channel 104 except for the effective channel 1041.

Specifically, in the case of an N-type device, a metal with a small work function, such as aluminium, hafnium, titanium, or N-type doped (n+) polysilicon, or Ru—Hf, WN, HfN, TiN, TaN, TaSiN, etc. with a small work function obtained by adjusting the composition of the compound, can be used as the rest portion 202 apart from portion 201 that corresponds to the effective channel 1041. The gate material for the portion 201 corresponding to the effective channel 1041 may use a large work function metal such as gold, platinum, or P-type doped (P+) polysilicon, or ITO, $RuO_2$, WN, MoN, and the like with a large work function obtained by adjusting the composition of the compound as the material of the gate. If it is a P-type device, a metal with a large work function, such as gold, platinum, or P-type doped ($P^+$) polysilicon, or ITO, $RuO_2$, WN, MoN, etc. with a large work function obtained by adjusting the composition of the compound can be used as the gate material for the rest portion 202 apart from the portion 201 corresponding to the effective channel 1041 in the first gate 20, and the portion 201 corresponding to the effective channel 1041 may use a metal with a small work function such as aluminum, hafnium, titanium, or N-type doped ($n^+$) polysilicon, or Ru—Hf, WN, HfN, TiN, TaN, TaSiN, etc. with a small work function obtained by adjusting the composition of the compound as the gate material.

Figure 8:
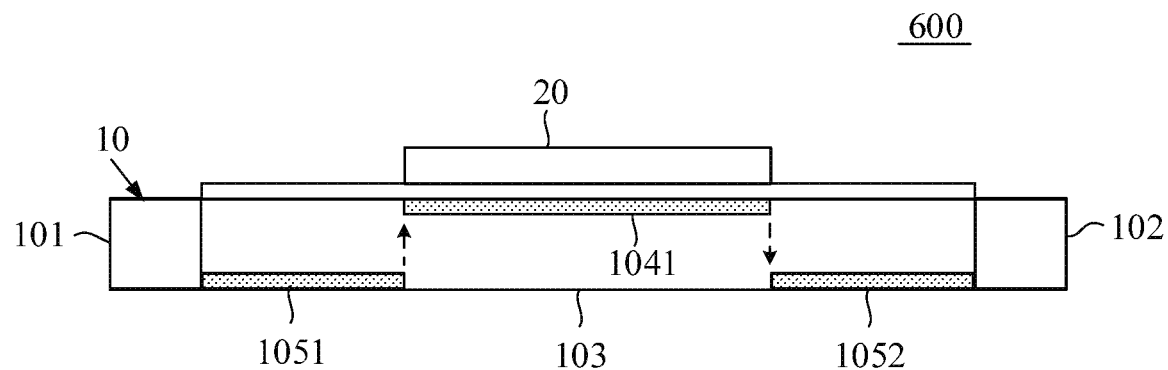

Referring to FIG. 8, in some alternative embodiments, the first gate 20 may also be provided on only the surface of one side of a portion of the channel region between the equivalent source 1051 and the equivalent drain 1052. Therefore no channel that connects the source region and the drain region will be formed below the first gate 20 even when a bias is applied to the first gate 20 to turn the device on (as shown in FIG. 8, the channel 1041 formed by the control of the first gate 20 now does not connect the source region 101 and the drain region 102). That is, the channel 1041 formed by the control of the first gate 20 in the channel region 103 is referred to as the "effective channel" described above.

The manner in which the conductive region is formed in the present invention is described below by some specific embodiments.

Embodiment 1

A conductive region A is formed by doping the introduced carriers on the surface of on side of the channel region 103A away from the effective channel 1041A.

Figure 9:
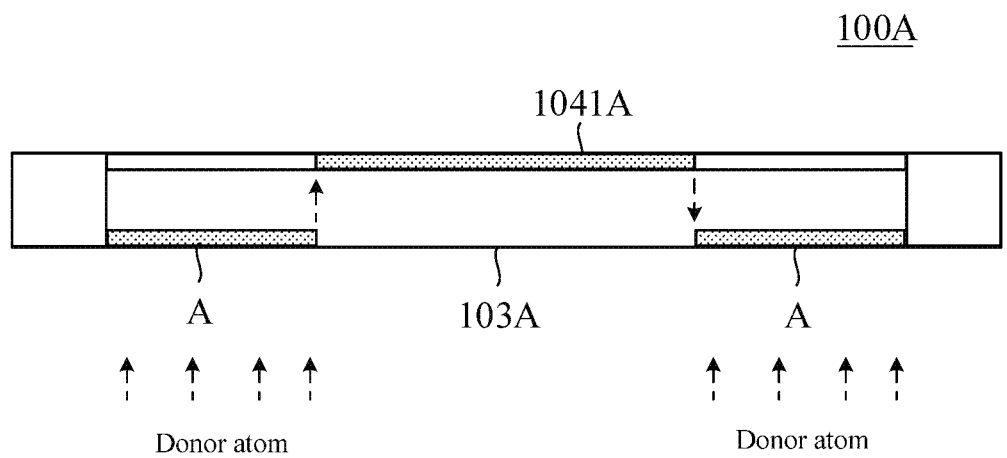
FIGS. 9-16 are schematic views of fabrication methods of the conductive region in various embodiments of the present invention.
Figure 10:
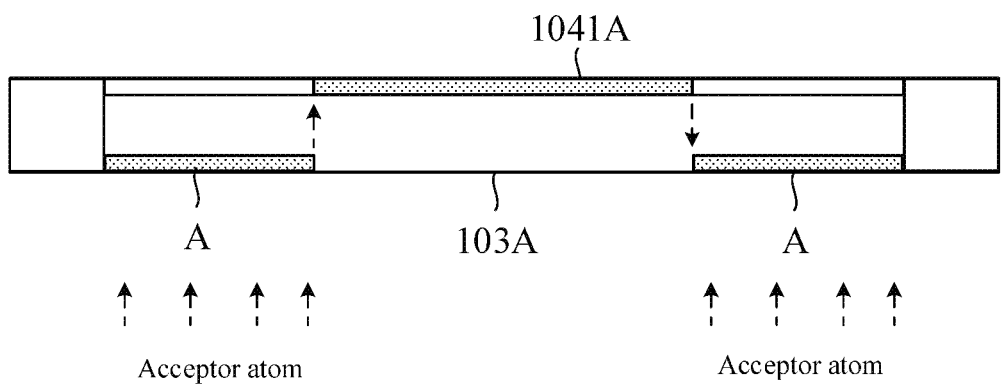

Accordingly, referring to FIG. 9, in the case of an N-type silicon-based device 100A, the doping concentration at the interface may be changed by doping a donor atom, such as phosphorus, arsenic, etc. on the surface of the channel region 103A away from the effective channel 1041A. Referring to FIG. 10, in the case of a P-type silicon-based device 100A, the doping concentration at the interface may be changed by doping an acceptor atom, such as boron, on the surface of the channel region 103A away from the effective channel 1041A.

Embodiment 2

Figure 11:
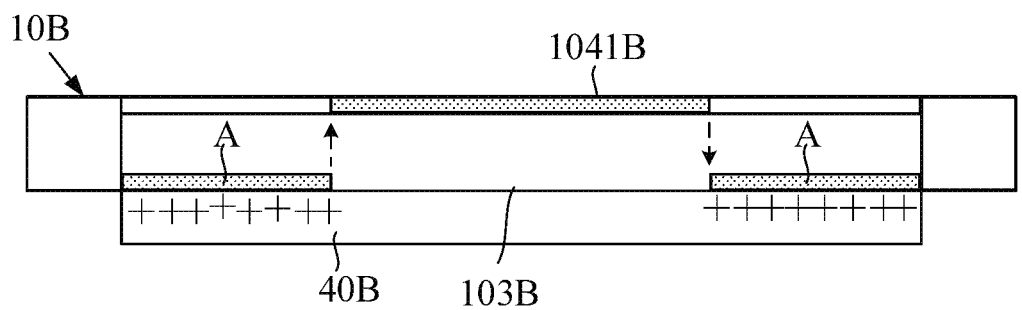
Figure 12:
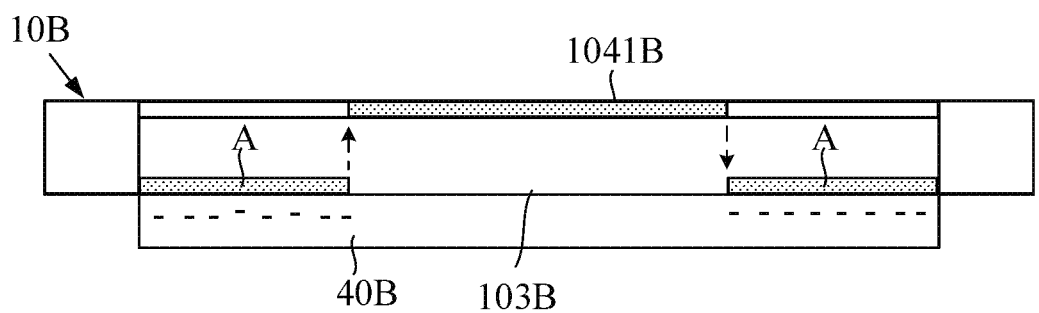

Referring to FIGS. 11 and 12, a field effect transistor device 100B further includes an insulating layer 40B provided on the surface of one side of the active layer 10B away from the effective channel 1041B, and the conductive region A is formed on the surface of one side of the channel region A by electrostatic induction from the injected charge in the insulating layer 40B.

Correspondingly, with reference to FIG. 11, in the case of an N-type device, this can be achieved by local injection of positive charges, such as $H^+$, a hole, in the insulating layer 40B; referring to FIG. 12, in the case of a P-type device, this can be achieved by local injection of negative charges, such as $F^-$, $Cl^-$, electrons, etc. in the insulating layer 40B. In this manner, a high density of fixed charges is formed in the insulating layer 40B, and carriers of the conductive region A are generated adjacent to the insulating layer 40B in the channel region 103B by electrostatic induction. It needs to be noted that "local" herein refers to a portion of the region in the insulating layer 40B that corresponds to the channel region and needs to form the conductive region A.

In a particular charge injection process, the charge is preferably injected into the insulating layer 40B at a location more proximate to the channel region 103B to enable the conductive region A formed in the channel region 103B to store more carriers. Of course, in some other alternative embodiments, a "double insulating layer" structure may also be used, specifically including a charge trapping layer provided on the surface of the channel region 103B, and a conventional insulating layer overlying the charge trapping layer. The charge trapping layer may be made of a material that is easier to store charges, or nanoparticles introduced therein with metal or semiconductors to more stably store charges, thereby ensuring stable and controllable carriers in the conductive region.

Embodiment 3

Figure 13:
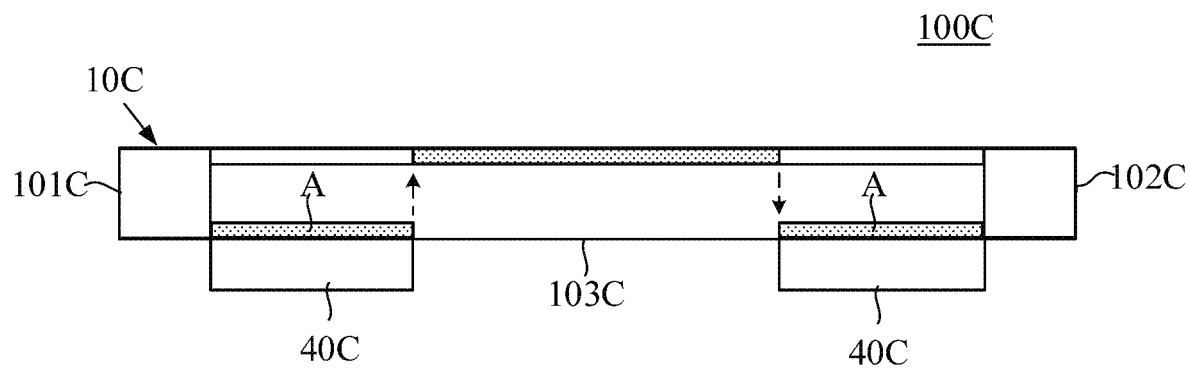

Referring to FIG. 13, a field effect transistor device 100C includes a semiconductor material layer 40C provided on the active layer 10C, the semiconductor material layer 40C and the active layer 10C constituting a heterostructure, and the conductive region A is formed of a two-dimensional electron gas channel or a two-dimensional hole gas channel distributed in the heterostructure.

Specifically, the semiconductor material layer 40C and the active layer 10C have different band gaps, and the semiconductor material layer 40C can be divided into two portions respectively connected to the source region 101C and the drain region 102C so that the formed two-dimensional electron gas channel does not conduct the source and drain regions.

Certainly, in some alternative embodiments, a two-dimensional electron gas channel or a two-dimensional hole gas channel may also be formed, such as by surface treating the channel region 103C. Such alternative embodiments of forming the two-dimensional electron gas channel or the two-dimensional hole gas channel known to those skilled in the art are intended to be within the scope of the present invention. Besides, the semiconductor material layer 40C may be a barrier layer, which may be doped or intrinsic.

Embodiment 4

Figure 14:
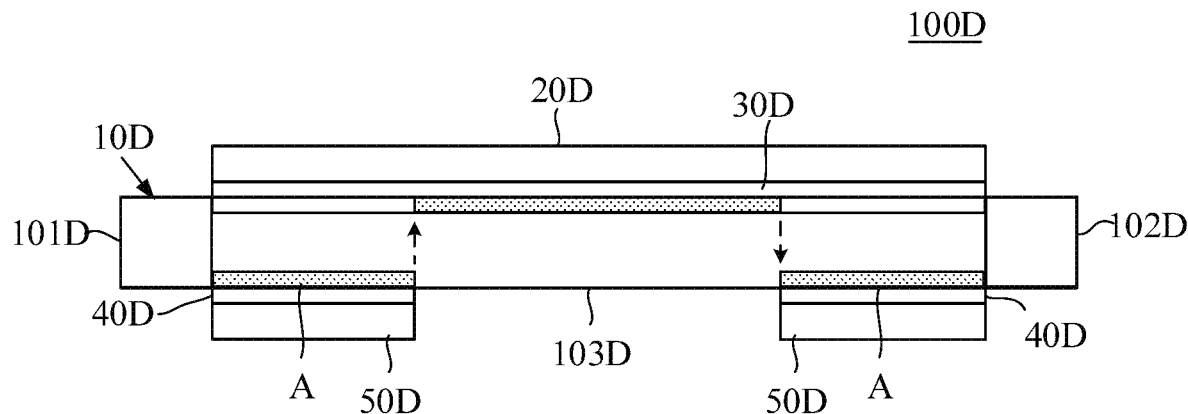

Referring to FIG. 14, a field effect transistor device 100D is fabricated as a device including at least two gates. Specifically, the field effect transistor device 100D includes a first gate insulating layer 30D and a first gate 20D sequentially provided on the surface of one side of the active layer 10D, and a second gate insulating layer 40D and a second gate 50D sequentially provided on the surface of one side of the active layer 10D adjacent to the conductive region A.

The second gate 50D is correspondingly divided into two portions, the vertical projection of one portion on the active layer 10D is connected to the source region 101D, and the vertical projection of the other portion on the active layer 10D is connected to the drain region 102D. Therefore, when a suitable bias is applied to the two portions of the second gate 50D, a conductive region A connecting with the source region 101D and a conductive region A connecting with the drain region 102D can be formed at corresponding positions in the channel region 103D, respectively.

In this embodiment, the absolute value of the bias applied to the second gate 50D should be greater than the absolute value of the turn-on voltage applied to the device. Accordingly, in the case of an N-type device, a positive bias greater than that of the first gate 20D is applied to the second gate 50D; in the case of a P-type device, a negative bias having an absolute value greater than that of the first gate 20D is applied to the second gate 50D.

Embodiment 5

Figure 15:
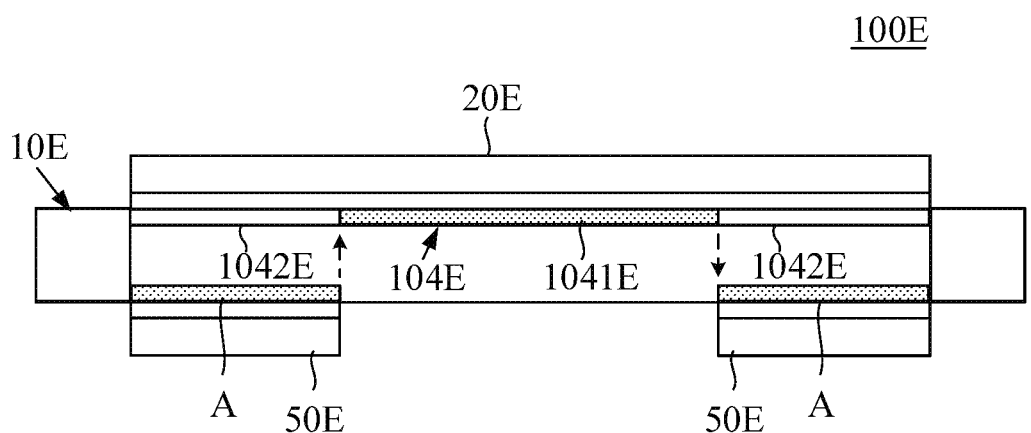

Referring to FIG. 15, a field effect transistor device 100E is fabricated to include at least two gates similar to that of embodiment 4. However, in this embodiment, in order to enable the conductance of the conductive region A to be greater than the conductance of the portion 1042E of the channel 104E other than the effective channel 1041E, the first gate 20E and the second gate 50E of different work function gate materials may be used. That is: it is realized by the scenario that the work function difference between the first gate 20E and the active layer 10E, and the work function difference between the second gate 50E and the active layer 10E are not equal.

Accordingly, if it is an N-type device, the first gate 20E can use a metal with a large work function, such as gold, platinum, or P-type doped (P+) polysilicon, or ITO, $RuO_2$, WN, MoN, etc. with a large work function obtained by adjusting the composition of the compound as the gate material; the second gate 50E may use a metal with a small work function such as aluminum, hafnium, titanium, or N-type doped (n+) polysilicon, or Ru—Hf, WN, HfN, TiN, TaN, TaSiN, etc. with a small work function obtained by adjusting the composition of the compound as the gate material. If it is a P-type device, a metal with a small work function, such as aluminium, hafnium, titanium, or N-type doped (n+) polysilicon, or Ru—Hf, WN, HfN, TiN, TaN, TaSiN, etc. with a small work function obtained by adjusting the composition of the compound, can be used as the gate material for the first gate 20E; the second gate 50E may use a large work function metal such as gold, platinum, or P-type doped (P+) polysilicon, or ITO, $RuO_2$, WN, MoN, and the like with a large work function obtained by adjusting the composition of the compound as the material of the gate.

Preferably, in an N-type device, the work function difference between the first gate 20E and the active layer 10E can be set to be greater than zero ($\Phi ms>0V$) so that the channel 104E is an enhancement channel; at the same time, the work function difference between the second gate 50E and the active layer 10E is set to be less than zero ($\Phi ms<0V$) so that the conductive region A can also form a certain number of carriers under the bias applied on the conductive region A when the device is in the off-state. In a P-type device, the work function difference between the first gate 20E and the active layer can be set to be less than zero ($\Phi ms<0V$) so that the channel 104E is an enhancement channel; at the same time, the work function difference between the second gate 50E and the active layer 10E is set to be greater than zero ($\Phi_{ms}>0V$) so that the conductive region A can also form a certain number of carriers under the bias applied on the conductive region A when the device is in the off-state.

Embodiment 6

Figure 16:
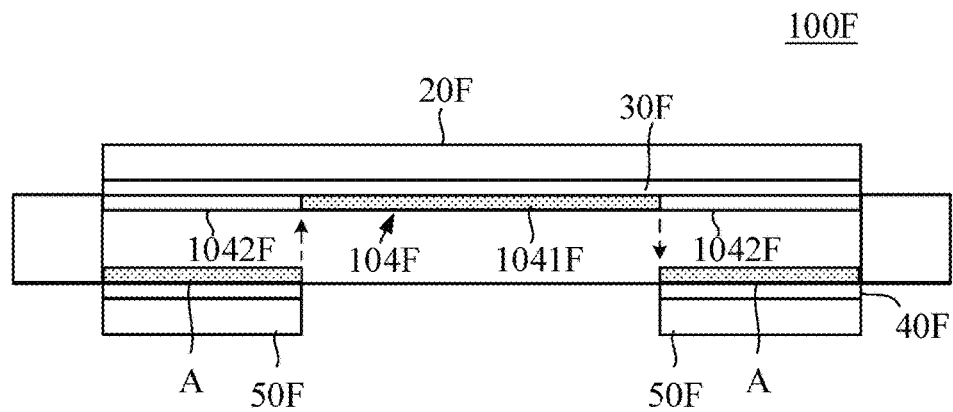

Referring to FIG. 16, a field effect transistor device 100F is fabricated to include at least two gates 20F and 50F similar to that of embodiment 4. However, differently, in this embodiment, in order to enable the conductance of the conductive region A to be greater than the conductance of the portion 1042F of the channel 104F other than the effective channel 1041F, the capacitance per unit area of the second gate insulating layer 40F may be set to be greater than the capacitance per unit area of the first gate insulating layer 30F.

Specifically, this can be achieved by adjusting the dielectric constants of the first gate insulating layer 30F and the second gate insulating layer 40F, or the thicknesses of the first gate insulating layer 30F and the second gate insulating layer 40F.

For example, when the thicknesses of the first gate insulating layer 30F and the second gate insulating layer 40F are equal, the dielectric constant of the second gate insulating layer 40F may be set to be higher than the dielectric constant of the first gate insulating layer 30F considering only the dielectric constant of the gate insulating layer. Illustratively, the first gate insulating layer 30F may employ silicon dioxide and the second gate insulating layer 40F may employ a high dielectric constant dielectric such as hafnium dioxide, aluminum oxide, etc.

For another example, when the materials of the first gate insulating layer 30F and the second gate insulating layer 40F are the same, the thickness of the second gate insulating layer 40F may be set to be smaller than the thickness of the first gate insulating layer 30F only considering the thickness of the gate insulating layer.

In specific device inventions, the second gate in embodiments 4-6 above may also be directly floating or grounded, avoiding excessive device connecting ends and increasing the complexity of the device invention.

Further, the manner in which the conductive regions are formed in each of the above embodiments may be applied in combination with each other to achieve a better implementation effect.

The field effect transistor device described in each of the above embodiments/embodiments may be a planar structure device or a vertical structure device. In the following, an SOI device (TFT device) will be taken as an example to exemplify the specific arrangement of the scheme of the present invention when applied to an SOI device.

Embodiment 7

Figure 17:
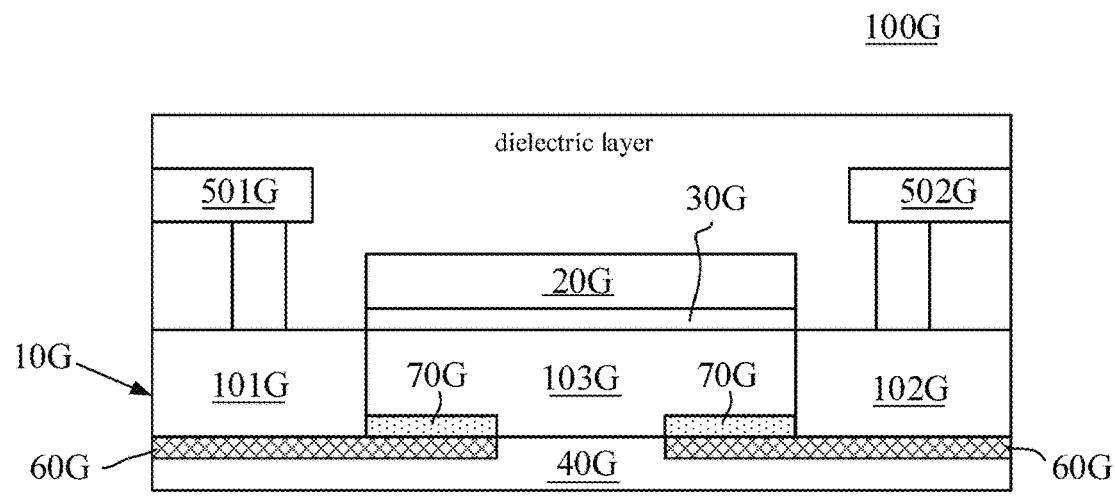
FIGS. 17 to 19 are schematic views of an SOI device according to an embodiment of the present invention.

Referring to FIG. 17, a TFT device 100G with a planar top gate structure is shown, including a transparent insulating substrate 40G, and an active layer 10G, a gate dielectric layer 30G, and a gate 20G which are successively arranged on the substrate 40G. Two sides of the active layer 10G are respectively doped to form a source region 101G and a drain region 102G, and are respectively externally connected to a source electrode and a drain electrode; the channel region 103G is located between the source region 101G and drain region 102G.

A positive charge region 60G is formed on two sides of the source region 101G and the drain region 102G by ion implantation and the like on the substrate 40G. Vertical projections of the positive charge region 60G and the gate 20G on the channel region 103G have an overlapping portion therebetween. Correspondingly, the positive charge region of the overlapping portion can form a two-dimensional electron gas 70G in the channel region 103G which is respectively connected to the source region 101G and the drain region 102G, wherein the two-dimensional electron gas 70G also constitutes a conductive region.

When the device is turned on, a channel is formed below the gate 20G, the portion of the channel that is vertically projected between the conductive regions constituting the actual effective channel.

Embodiment 8

Figure 18:
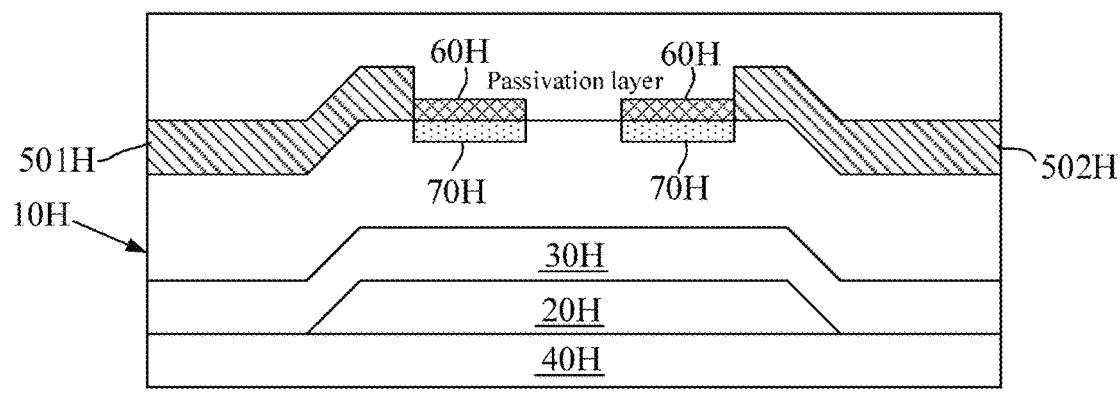

Referring to FIG. 18, the TFT device 100H with a planar bottom gate structure is shown, including a transparent insulating substrate 40H, and a gate 20H, a gate dielectric layer 30H, and an active layer 10H which are successively arranged on the substrate 40H. In the present embodiment, an upper-layer metal source electrode 501H and a metal drain electrode 502H are respectively provided on two sides of an active layer 10H. The active layer 10H can adopt an amorphous IGZO metal oxide semiconductor layer, and an ohmic contact is formed between the source electrode 501H and the drain electrode 502H and the active layer 10H. Portions of the active layer below the source electrode 501H and the drain electrode 502H constitute a source region and a drain region respectively, a channel region being located between the source region and the drain region.

The positive charge region 60H respectively connected to the source electrode 501H and drain electrode 502H is ion implanted in a passivation layer covered on the upper layer of the device. The vertical projections of the positive charge region 60H and the gate 20H on the channel region have an overlapping portion. Correspondingly, the positive charge region of the overlapping portion can form a two-dimensional electron gas 70H in the channel region which is respectively connected to the source region and the drain region, wherein the two-dimensional electron gas 70H also constitutes a conductive region.

When the device is turned on, a channel is formed over the gate 20H, with the portion of the channel vertically projected between the conductive regions 70H constituting the actual effective channel.

Embodiment 9

Figure 19:
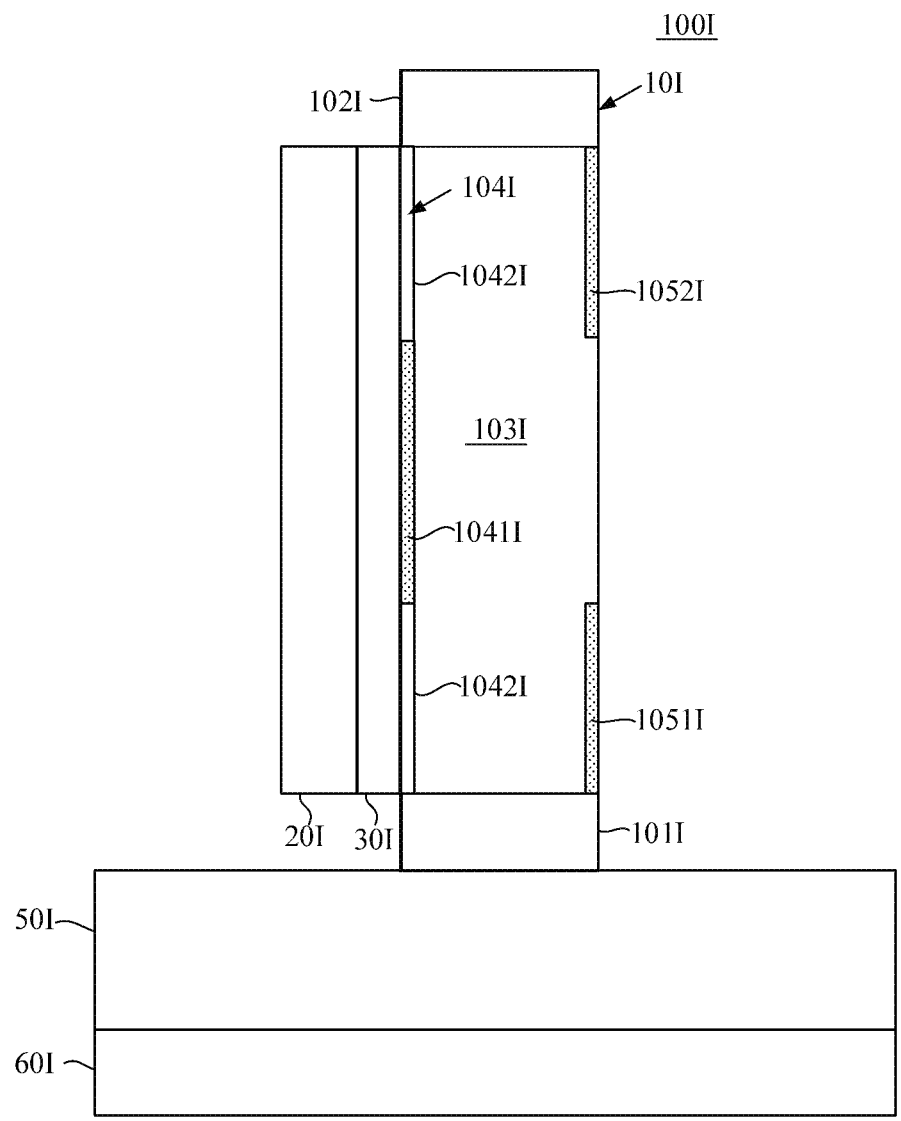

Referring to FIG. 19, the SOI device 100I has a vertical structure, and comprises a substrate 60I, a buried insulating layer 50I and an active layer 10I successively arranged on the substrate 60I, and a gate insulating layer 30I and a gate 20I arranged on one side of the active layer 10I. The source region 101I and the drain region 102I are located below and above the active layer 10I, respectively, in a direction away from the substrate 60I. An equivalent source 1051I in connection with the source region 101I and an equivalent drain 1052I in connection with the drain region 102I are formed in the channel region 103I.

When the device is turned on by applying a bias to the gate 20I of the device, the gate 20I controls the formation of a channel 104I in the channel region 103I of the device that connects the source region 101I and the drain region 102I. But only the portion of the channel 104I that does not overlap with the vertical projections of the equivalent source 1051I and the equivalent drain 1052I on the channel region 103I constitutes an effective channel 1041I for conducting the operating current when the device is turned on, i.e., the remaining portion 1042I in the channel 104I is not used for conducting the operating current when the device is turned on.

In each of the above-mentioned embodiments/embodiments, the source region and the drain region in the device can be a common heavily doped semiconductor source and drain, and can also be a Schottky metal source and drain of a metal-semiconductor structure; the gate can be a common metal-insulating layer-semiconductor MOS structure gate, and can also be a Schottky junction gate of a metal semiconductor structure; the active layer may be composed of a single semiconductor material or may include at least two semiconductor materials changing along its thickness or planar extension to form a composite channel.

Besides, the equivalent source and the equivalent drain may be formed spontaneously or may be formed by gate control of a corresponding structure.

Figure 20:
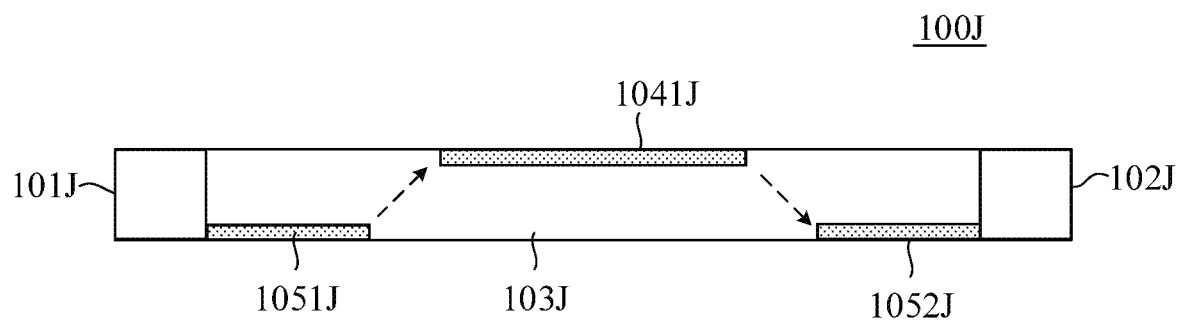
FIG. 20 is a schematic structural diagram of a field effect transistor device having a space between the vertical projections of an effective channel and a conductive region on a channel region according to an embodiment of the present invention.

In general, in the embodiments described above, vertical projections of the effective channel, the equivalent source and/or the equivalent drain superimposed on the channel region are in connection with the source region and the drain region, thereby ensuring that carriers of the effective channel and the equivalent source and/or the equivalent drain can be injected unidirectionally or bidirectionally at least in the thickness direction and constructing a carrier passage from the source region to the drain region. Of course, with reference to FIG. 20, the present invention does not exclude that, in some particular embodiments, if the vertical projections of the effective channel, the equivalent source and/or equivalent drain, superimposed on the channel region 103J are not able to connect the source region 101J with the drain region 102J of the device 100J, but has an "appropriate spacing" which fails to completely cut off the passage of carriers from the equivalent source 1051J to the effective channel 1041J and from the effective channel 1041J to the equivalent drain 1052J, the injection direction of the carriers among the effective channel 1041J, equivalent source 1051J, and equivalent drain 1052J is at an included angle with the direction of the thickness of the channel region 103J, and such an embodiment should also fall within the protection scope of the present invention.

The present invention also provides a specific embodiment of a method for improving the short-channel effect and output characteristics of a field effect transistor device. In the present embodiment, the method comprises providing an equivalent source and/or an equivalent drain in the channel region of the device away from the effective channel of the device such that when the device is turned on, the effective channel connects the source region and the drain region of the device through the equivalent source and/or equivalent drain to form an operating current.

Since the method for improving the short-channel effect and the output characteristic herein substantially corresponds to the structural embodiment of the above-mentioned field effect transistor device, it is possible to partially or completely refer to the contents of the above-mentioned structural embodiment and it will not be described in detail herein.

The following is the simulation verification result of the SOI device applying the above embodiments/embodiments of the present invention. In the simulations, devices with only an equivalent source, only an equivalent drain, and both an equivalent source and an equivalent drain are referred to as an equivalent source device, an equivalent drain device, and an equivalent source-drain device, respectively. In the simulation example, the comparison object of the above-mentioned device is a conventional SOI device, the channel length thereof is the same as the effective channel length of the device of the present invention, and relevant parameters, such as the channel material and gate, are all kept consistent.

SIMULATION EXAMPLE 1

Figure 21:
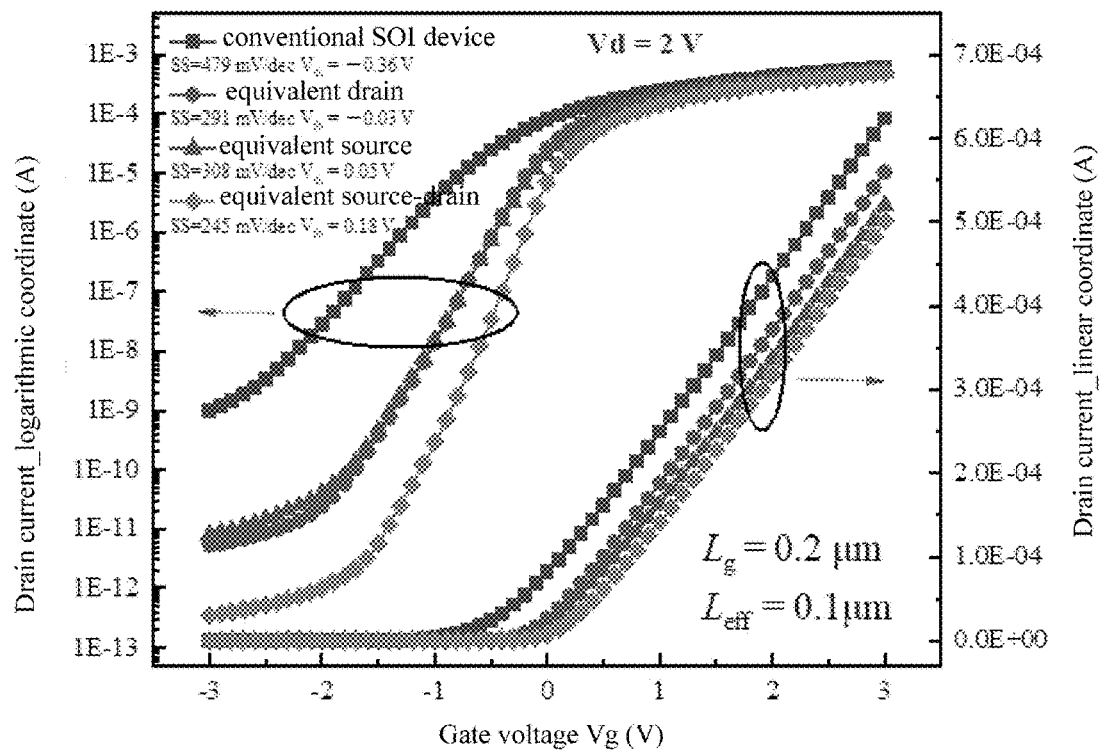
FIGS. 21 and 22 are diagrams in which the transfer characteristics of an SOI device according to the present invention and a conventional SOI device are compared.
Figure 22:
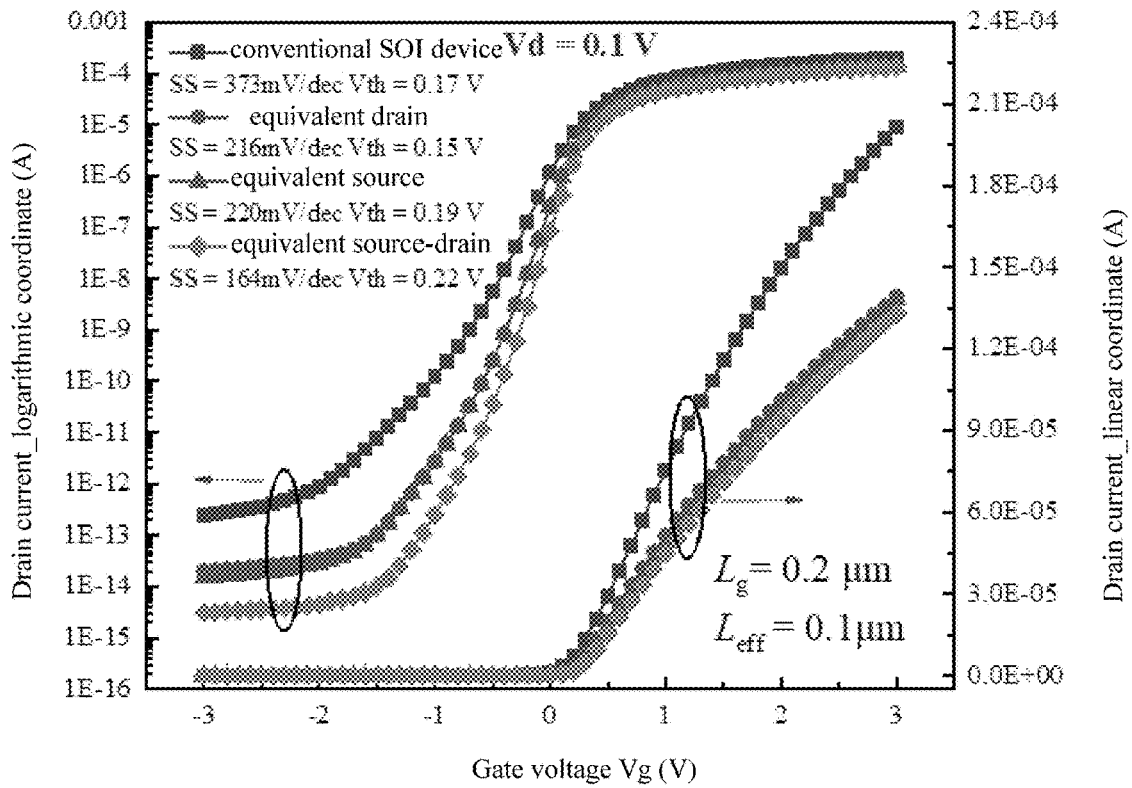

Simulation software: Silvaco TCAD;

The schematic structural diagram of the device in the simulation is shown in FIG. 21, and the specific parameters are as follows:

① the material of the channel region is Si, and the thickness is 0.05 μm;
② the P-type doping concentration in the channel region is $1 \times 10^{17}$ cm$^{-3}$;
③ the material of the gate insulating layer is SiO$_2$, and the thickness is 17 nm;
④ the conventional SOI device, the channel length L=0.1 μm;
⑤ the apparent gate length of the device of the present invention is $L_g$=0.2 μm;
⑥ the effective channel length of the device of the present invention is $L_{eff}$=0.1 μm;
⑦ the equivalent source device, with an equivalent source length of 0.1 μm;
⑧ the equivalent drain device, with an equivalent source length of 0.1 μm;
⑨ the equivalent source-drain device, with both the equivalent source and the equivalent drain length being 0.05 μm;
⑩ the N-type doping concentration in the source and drain regions is $1 \times 10^{20}$ cm$^{-3}$;

⑪ the fixed positive charge surface density at the channel back interface where the equivalent source-drain is formed is 1E14 cm$^{-2}$;

⑫ the voltage of the drain terminal is $V_{ds}$=2V or 0.1V;

Referring to FIGS. 21 and 22, there are shown comparison diagrams of the transfer characteristics of the device of the present invention and of the conventional SOI device. As can be seen from FIG. 21, the conventional SOI device subthreshold swing SS is 479 mV/dec when $V_{ds}$=2V. In comparison, the subthreshold swings of the equivalent drain device (SS=291 mV/dec) and the equivalent source device (SS=308 mV/dec) are significantly reduced, while the improvement of the subthreshold swing of the equivalent source-drain device (SS=245 mV/dec) is particularly significant. Comparing FIGS. 21 and 22, it can be seen that the threshold voltage of the conventional SOI device is significantly reduced when $V_{ds}$=2V (the threshold voltage Π0.36V when $V_{ds}$=2V is reduced by 0.53V compared to threshold voltage 0.17V when $V_{ds}$=0.1V) due to the short-channel effect. Compared to that, the variation in the threshold voltage of the device of the present invention is much smaller (the equivalent drain, the equivalent source, and the equivalent source-drain device have threshold voltage reductions of only 0.18V, 0.14V, and 0.04V, respectively). At the same time, the field effect mobility ratio of the device of the present invention is only slightly reduced compared to that of the conventional SOI device (when $V_{ds}$=2V, the mobility ratios of the equivalent drain, equivalent source, and equivalent source-drain devices are 99.7%, 94.9%, and 96.1% of that of the conventional SOI device, respectively). Therefore, embodiments/embodiments provided herein are capable of effectively improving the short-channel effect of a device with little sacrifice in device performance.

Figure 23:
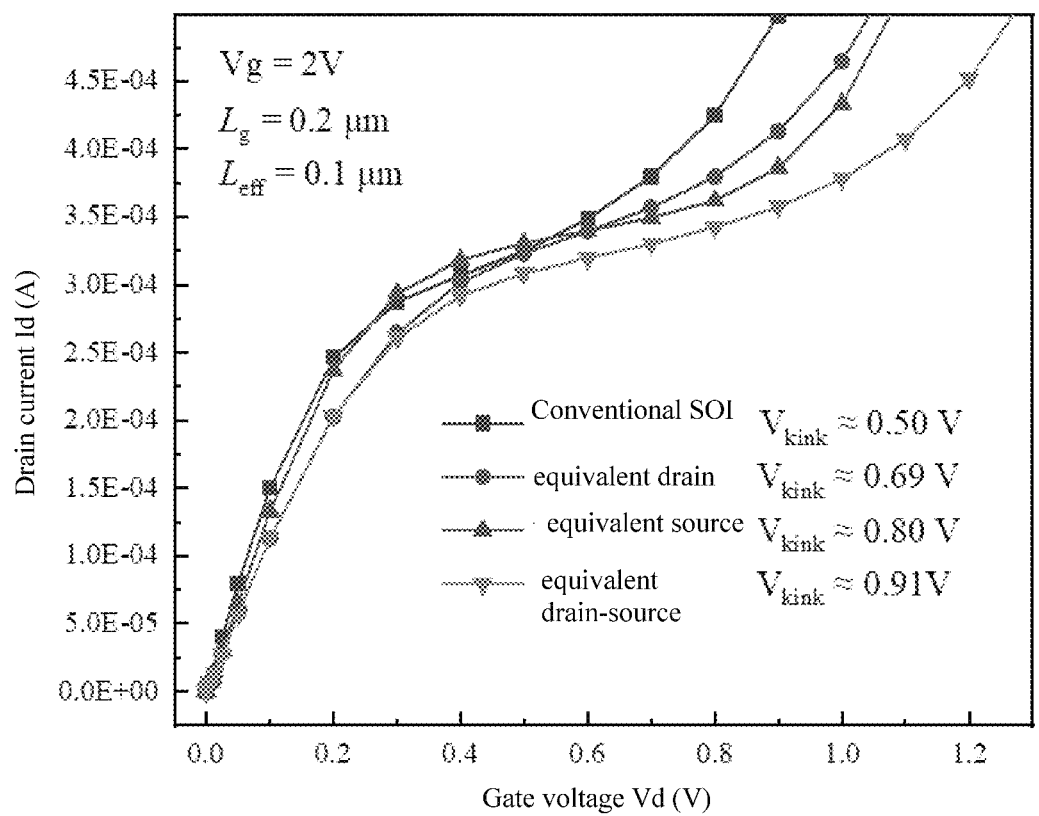
FIGS. 23 and 24 are diagrams in which the output characteristics of an SOI device according to the present invention and a conventional SOI device are compared.
Figure 24:
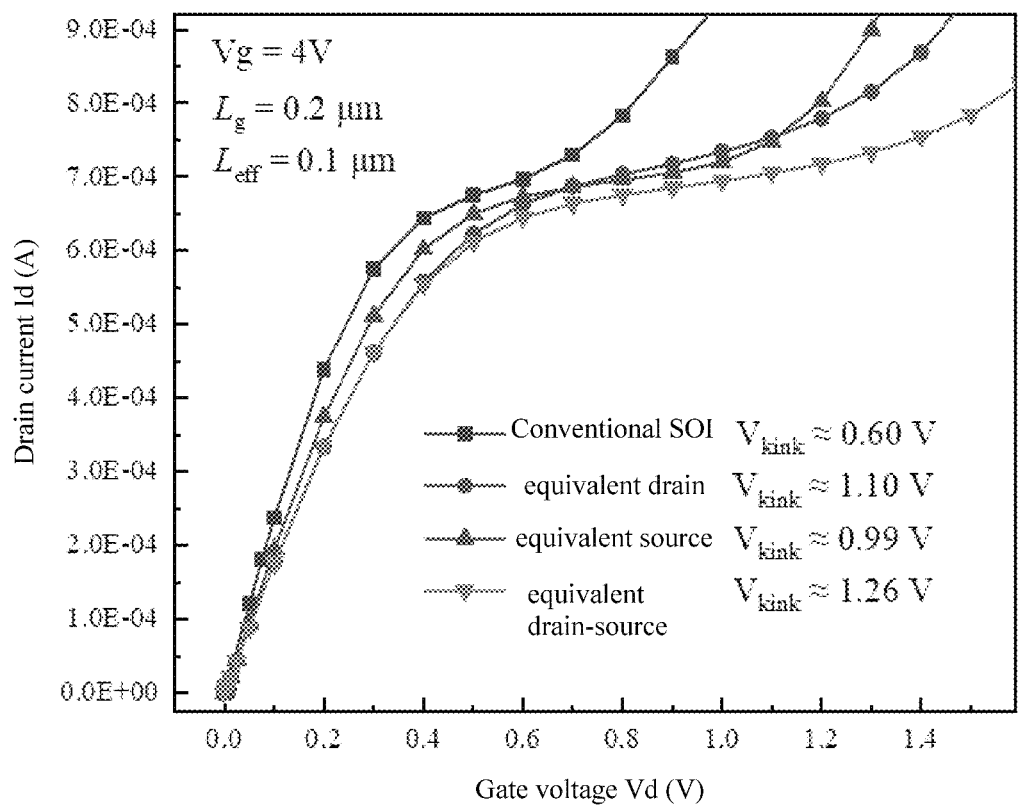

Referring to FIGS. 23 and 24, there are shown comparison diagrams of the output characteristics of the device of the present invention with those of a conventional SOI device. It can be seen from the figures that the output characteristic curve of the device of the present invention is flatter and has a wider operating range no matter $V_{gs}$=2V or $V_{gs}$=4V. The $V_{ds}$ corresponding to the significant occurrence of KINK current in the output characteristics is $V_{kink}$. The larger the $V_{kink}$ is, the weaker the carrier impact ionization effect in the drain terminal depletion region of the device is, and the more difficult the kink current effect is to occur in the device. Taking $V_{gs}$=4V as an example (FIG. 24), $V_{kink}$=0.60V for the conventional SOI device, while the $V_{kinks}$ of the equivalent drain, equivalent source, and equivalent source-drain devices are 1.10V, 0.99V, and 1.26V, respectively, which shows that the device of the present invention can effectively reduce the carrier impact ionization effect, suppress the KINK current, and improve the output characteristics of the device. Meanwhile, it is observed from FIGS. 23 and 24 that the output current of the device of the present invention is equivalent to that of the conventional SOI device without any drop.

The present invention has the following beneficial technical effects through the above-mentioned embodiments.

1) By setting the device to be turned on, an effective channel, and an equivalent source and an equivalent drain away from the effective channel can be formed in the channel region so that the source region and the drain region are in connection to form an operating current. In this way, the equivalent drain (source) in connection with the drain (source) region is structurally away from the effective channel, so that the influence of the drain terminal voltage on the effective channel can be reduced, thereby improving the short-channel effect of the device.

2) Through the arrangement of the equivalent source and the equivalent drain, according to the device of the present invention, the peak value electric field in the depletion region at the drain end of the channel in the saturated operating state of the device is reduced, thereby greatly reducing the carrier impact ionization effect in the device drain depletion region, suppressing the kink current of the output characteristics of the device, and improving the output characteristics of the device. Meanwhile, the device of the present invention can suppress the hot carrier degradation effect of the device and improve the reliability of the device.

It should be understood that the described embodiments of the present invention are for illustrative purposes only and are not intended to limit the scope of the invention. Those skilled in the art can make various other replacements, changes, and improvements within the scope of the invention. Therefore, the invention is not limited to the above embodiments, and is only defined by the claims.

What is claimed is:

1. A field effect transistor device comprising an active layer, the active layer including a source region, a drain region, and a channel region located between the source region and the drain region;
   wherein a conductive region that does not connect the source region with the drain region is formed in the channel region; when the conductive region is in connection with the source region, the conductive region constitutes an equivalent source; when the conductive region is in connection with the drain region, the conductive region constitutes an equivalent drain;
   wherein the field effect transistor device further comprises a first gate provided on a surface of one side of the active layer, wherein perpendicular projections of the first gate and the conductive region on the channel region overlap; wherein the first gate is capable of controlling the channel region and forms a channel therein, and a portion of the channel that does not overlap with the vertical projection of the conductive region on the channel region constitutes an effective channel;
   when the device is turned on, the effective channel as well as an equivalent source and/or an equivalent drain spaced away from the effective channel are formed in the channel region, a conductance of the conductive region is greater than a conductance of a portion of the channel other than the effective channel, so that at least one of the conductive region and effective channel can inject carriers into the other;
   when the effective channel and the equivalent source are formed in the channel region, the source region is connected with the drain region through the equivalent source and the effective channel, so as to form an operating current;
   when the effective channel and the equivalent drain are formed in the channel region, the source region is connected with the drain region through the effective channel and the equivalent drain, so as to form an operating current; and
   when the effective channel, the equivalent source and the equivalent drain are formed in the channel region, the source region is connected with the drain region through the equivalent source, effective channel and the effective drain, so as to form an operating current.

2. The field effect transistor device according to claim 1, wherein the conductive region is spaced at a distance from the effective channel in a thickness direction of the channel region.

3. The field effect transistor device according to claim 1, wherein the conductance of the conductive region is greater than at least three times of the conductance of the rest portion of the channel other than the effective channel when the device is turned on.

4. The field effect transistor device according to claim 1, wherein a conductance per unit length of the effective channel in the channel is smaller than the conductance per unit length of the rest portion of the channel other than the effective channel when the device is turned on.

5. The field effect transistor device according to claim 4, wherein the conductance per unit length of the effective channel of the channel is at least smaller than three times of the conductance per unit length of the rest portion of the channel other than the effective channel when the device is turned on.

6. The field effect transistor device according to claim 4, comprising a gate insulating layer provided between the first gate and the channel region, wherein a thickness of a portion of the gate insulating layer corresponding to the effective channel is larger than the thickness of the rest portion of the gate insulating layer.

7. The field effect transistor device according to claim 1, wherein a portion of the first gate corresponding to the effective channel and the rest portion of the first gate are made of materials having different work functions.

8. The field effect transistor device according to claim 1, further comprising a second gate provided on a surface of one side of the active layer adjacent to the conductive region, wherein the second gate is capable of controlling the conductive region to be formed in the channel region.

9. The field effect transistor device according to claim 1, wherein the conductive region is formed by a layer of carriers introduced by surface doping on one side of the channel region away from the effective channel.

10. The field effect transistor device according to claim 1, further comprising an insulating layer provided on a surface of one side of the active layer away from the effective channel, wherein the conductive region is composed of carriers induced in the channel region adjacent to the insulating layer, said carriers being induced through electrostatic induction by electric charges introduced in the insulating layer.

11. The field effect transistor device according to claim 1, characterized by further comprising a semiconductor material layer provided on a surface of one side of the active layer away from the effective channel, the active layer and the semiconductor material layer forming a heterostructure, and the conductive region being composed by a two-dimensional electron gas channel or a two-dimensional hole gas channel distributed in the heterostructure.

12. The field effect transistor device according to claim 1, wherein the conductive region is composed of a two-dimensional electron gas channel or a two-dimensional hole gas channel formed by surface-treating a surface of one side of the channel region away from the effective channel.

13. The field effect transistor device according to claim 1, wherein the source region and the drain region are a doped semiconductor or a Schottky metal source and drain.

14. The field effect transistor device according to claim 1, wherein a gate of the field effect transistor device is a metal-insulating layer-semiconductor MOS structure gate or a Schottky junction gate.

15. The field effect transistor device according to claim 1, wherein the active layer comprises at least two semiconductor materials changing along a thickness direction or a planar extension direction of the active layer.

16. The field effect transistor device according to claim 1, wherein the field effect transistor device is a planar structure device or a vertical structure device.

* * * * *